United States Patent
Heyrman et al.

(10) Patent No.: US 11,586,360 B2
(45) Date of Patent: Feb. 21, 2023

(54) HYBRID MEMORY MIRRORING USING STORAGE CLASS MEMORY

(71) Applicant: International Business Machines Corporation, Armonk, NY (US)

(72) Inventors: Peter J. Heyrman, Rochester, MN (US); David A. Larson Stanton, Rochester, MN (US); Warren E. Maule, Cedar Park, TX (US); Adam J. McPadden, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 17/320,269

(22) Filed: May 14, 2021

(65) Prior Publication Data
US 2022/0365685 A1   Nov. 17, 2022

(51) Int. Cl.
*G06F 3/06* (2006.01)

(52) U.S. Cl.
CPC ............ *G06F 3/0619* (2013.01); *G06F 3/065* (2013.01); *G06F 3/0653* (2013.01); *G06F 3/0679* (2013.01)

(58) Field of Classification Search
CPC ...... G06F 3/0619; G06F 3/065; G06F 3/0653; G06F 3/0679
See application file for complete search history.

(56) References Cited

U.S. PATENT DOCUMENTS

| | | |
|---|---|---|
| 9,070,424 B2 | 6/2015 | Youn |
| 9,208,106 B2 | 12/2015 | Bickelman |
| 2018/0067660 A1* | 3/2018 | Yamamoto ............ G06F 3/0641 |
| 2020/0133836 A1* | 4/2020 | Mizushima ........... G06F 3/0652 |

OTHER PUBLICATIONS

"Do You VMOSA?", DeinosCloud, Aug. 28, 2014, 20 pages.
"Dynamic capacity improvement of main memory isolating DRAM/FLASH in NVDIMM-N with aided power savings", An IP.com Prior Art Database Technical Disclosure, IP.com No. IPCOM000256187D, Nov. 12, 2018, 7 pages.
"Method to Improve Memory DIMM Diagnose on Enterprise Server", An IP.com Prior Art Database Technical Disclosure, IP.com No. IPCOM000235424D, Feb. 26, 2014, 4 pages.
"SSD/ENT: Read-Optimized Mirrored RAID Using Mixed Drive Classes", An IP.com Prior Art Database Technical Disclosure, IP.com No. IPCOM000192666D, Jan. 28, 2010, 4 pages.
"Storage Class Memory", IBM Almaden Research Center, Jan. 2013, 27 pages.
Fan, Charles, "Adopting Persistent Memory in New Memory Converged Infrastructures", Proceedings of the Storage Developer Conference, Sep. 23-26, 2019, Santa Clara, California, 9 pages.
Li et al., "Enabling Memory Reliability, Availability, and Serviceability Features on Dell PowerEdge Servers", Dell Power Solutions, Aug. 2005, 4 pages, <www.dell.com/powersolutions>.

\* cited by examiner

*Primary Examiner* — Hiep T Nguyen
(74) *Attorney, Agent, or Firm* — Edward J. Wixted, III (57) ABSTRACT

In an approach a request to write data to memory is received, wherein the memory includes: a first set of dynamic random-access memory (DRAM) accessible via a first memory channel, and a first set of storage class (SCM) memory accessible via a second memory channel. The data is written to the first set of DRAM via the first memory channel. The data is mirrored to the first set of SCM via the second memory channel.

20 Claims, 9 Drawing Sheets

FIG. 9

HYBRID MEMORY MIRRORING USING STORAGE CLASS MEMORY

BACKGROUND

The present invention relates generally to the field of data replication and redundancy, and more particularly to memory mirroring with storage class memory (SCM).

Memory mirroring is the division of memory into two channels. Data sent through a first channel is stored to a first memory bank and mirrored to a second channel where the data is stored to a second memory bank, creating as redundant copy of the memory. Typically, a first half of the memory is the main system memory, and the other half of the memory acts as a backup such that if the first memory bank fails, the second memory bank has redundantly stored the data and thus, may be able to provide the missing data. Generally, on a memory read, data is read back from the main system memory and the backup is ready if, for example, an uncorrectable error is detected on the read operation. Memory mirroring increases data reliability.

Dynamic random-access memory (DRAM) is a type of random-access semiconductor memory that stores each bit of data in a memory cell consisting of a capacitor and a transistor, both the capacitor and transistor typically based on metal-oxide semiconductor (MOS) technology. DRAM typically takes the form of an integrated circuit chip. One of the largest applications for DRAM is the main memory in modern computers.

SCM, or persistent memory (P-MEM), treats fast non-volatile memory as DRAM and includes the fast non-volatile memory in the memory space of a server. Access to data in the memory space of the server is faster than access to data in local, PCI-connected solid-state drives (SSDs), direct-attach disks, or an external array.

SUMMARY

Aspects of an embodiment of the present invention disclose a computer-implemented method, a computer program product, and a computer system. A request to write data to memory is received, wherein the memory includes: a first set of dynamic random-access memory (DRAM) accessible via a first memory channel, and a first set of storage class (SCM) memory accessible via a second memory channel. The data is written to the first set of DRAM via the first memory channel. The data is mirrored to the first set of SCM via the second memory channel.

DETAILED DESCRIPTION

Embodiments of the present invention recognize that typical approaches to memory mirroring are expensive and reduce usable memory space of applications. For example, in some presently known memory mirroring approaches a customer is required to obtain or pay for all of the physical dynamic random-access memory (DRAM) dual in-line memory modules (DIMMs), but applications are only able to utilize the logical DRAM space, which is half of the physical memory connected to the system (as the other half of the physical memory is used for mirroring and data redundancy). Embodiments of the present invention recognize that such an approach effectively doubles the cost of usable memory. Embodiments of the present invention recognize that emerging storage class memory (SCM) has higher capacity and is less expensive than DRAM used in main memory. Embodiments of the present invention provide an approach to replace the memory used for mirrored data with lower cost SCM and add the SCM to the main memory.

Figure 1:
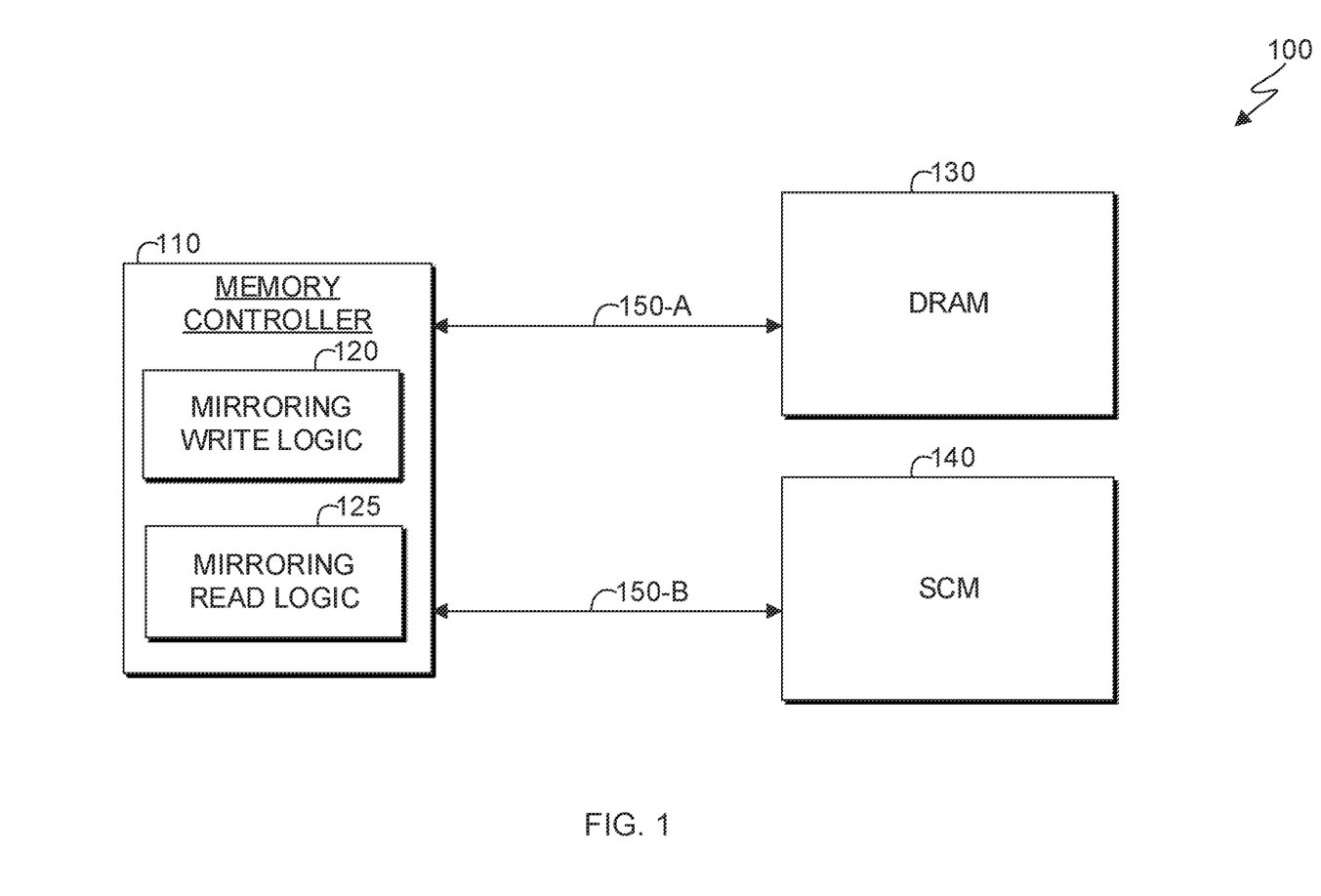
FIG. 1 is a functional block diagram illustrating a memory system of a computing device, in accordance with an embodiment of the present invention.
Figure 9:
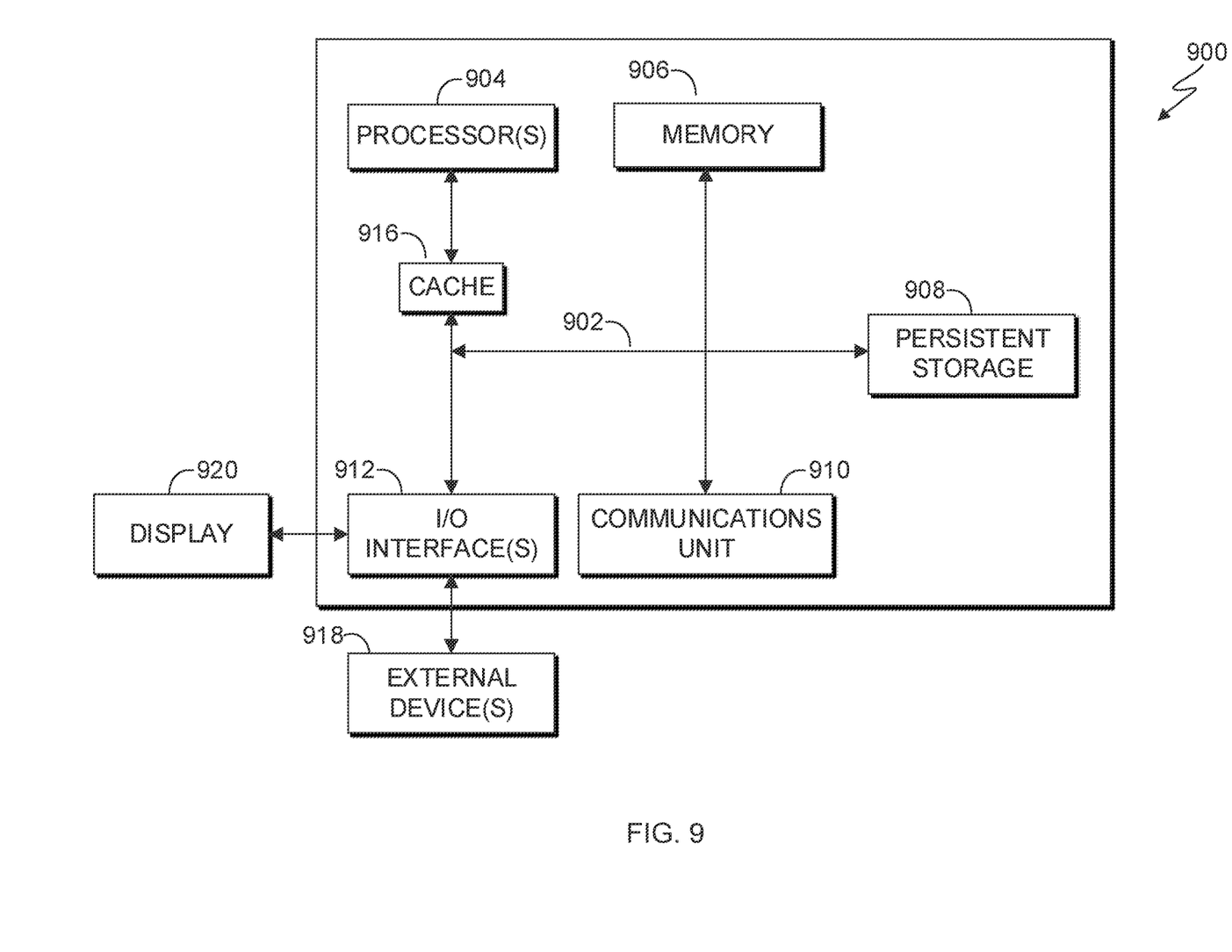
FIG. 9 is a block diagram of components of the computing device corresponding to embodiments of the memory system depicted in FIG. 1, FIG. 3, and FIG. 6, in accordance with an embodiment of the present invention.

FIG. 1 depicts a block diagram of components of a memory system 100 of a computing device, such as computing device 900 as depicted in greater detail in FIG. 9, in accordance with an embodiment of the present invention. FIG. 1 depicts memory controller 110 operably connected to: (i) DRAM 130 via memory channel 150-A and (ii) SCM 140 via memory channel 150-B. While the embodiment depicted in FIG. 1 depicts two memory channels 150 and one memory controller 110, memory system 100 may include any number of memory controllers and memory channels.

DRAM 130 represents a DRAM dual in-line memory module (DIMM) or a pool comprising multiple DRAM DIMMs. DRAM 130 may be, for example, mounted on a printed circuit board. DRAM 130 may include a series of DRAM integrated circuits.

SCM 140 represents a SCM DIMM or a pool comprising multiple SCM DIMMs. In general, SCM 140 is a type of memory that provides both nonvolatile and random-access characteristics. SCM 140 reduces data latencies by providing memory-like byte-addressable access to data, thus reducing the need to read and perform garbage collection. SCM 140 may refer to persistent, byte addressable storage that is accessible via the memory bus. One skilled in the art of computing will appreciate that other terms may also refer to SCM storage. For example, BAS may refer to "Byte Addressable Storage," NVM to "Non-Volatile Memory," and PM to "Persistent Memory" may also refer to such storage. SCM 140 may be, for example, mounted on a printed circuit board. SCM may include a series of SCM integrated circuits.

Memory channels 150 are the links between memory (e.g., memory 906 of computing device 900) and a processor (e.g., processor(s) 904 of computing device 900) via memory controller 110. In some embodiments, memory channel 150-A and memory channel 150-B may each be, for example, 64-bit data channels. Having multiple memory channels 150 allows for fast data exchange as data can be sent on more than one channel and data can be sent in parallel (e.g., cache lines can be sent simultaneously via memory channel 150-A and memory channel 150-B). In the embodiment depicted in FIG. 1, DRAM 130 is operably connected to memory controller 110 via memory channel 150-A and SCM 140 is operably connected to memory controller 110 via memory channel 150-B.

Memory controller 110 is configured to control multiple DIMMs. In some embodiments, memory controller 110 is implemented as an individual integrated circuit. In other embodiments, memory controller 110 is placed on the same die as a microprocessor. In some embodiments, memory controller 110 includes mirroring write logic 120 and mirroring read logic 125. In some embodiments memory controller 110 includes one or more registers (not depicted).

Mirroring write logic 120 may be implemented on memory controller 110 or may be located elsewhere in memory. For example, mirroring write logic 120 may be imbedded/incorporated into the processor architecture and design. Mirroring write logic 120 is configured to coordinate memory mirroring when writing data to memory (e.g., memory 906 of computing device 900). More particularly, mirroring write logic 120 causes data to be written to both DRAM 130 and SCM 140 across separate memory channels 150. A register (not depicted) may retain the location(s) in DRAM 130 of the original data, along with the location(s) in SCM 140 of the duplicated copy of the data. As depicted in FIG. 1, mirroring write logic 120 causes data to be written to DRAM 130 via memory channel 150-A and mirroring write logic 120 data is written to SCM 140 via memory channel 150-B. Mirroring write logic 120 may be software or firmware or a combination of both.

Mirroring read logic 125 may be implemented on memory controller 110 or may be located elsewhere in memory. For example, mirroring read logic 125 may be imbedded/incorporated into the processor architecture and design. Mirroring read logic is configured to retrieve data that has been mirrored and stored to DRAM 130 and SCM 140. More particularly, mirroring read logic 125 attempts to retrieve data from DRAM 130 and, if the retrieval is unsuccessful, mirroring read logic 125 retrieves the mirrored copy of the data from SCM 140 based on location data stored to a register. As depicted in FIG. 1, mirroring read logic 125 accesses DRAM 130 and SCM 140 via separate memory channels 150. Mirroring read logic 125 may be software or firmware or a combination of both.

Figure 2:
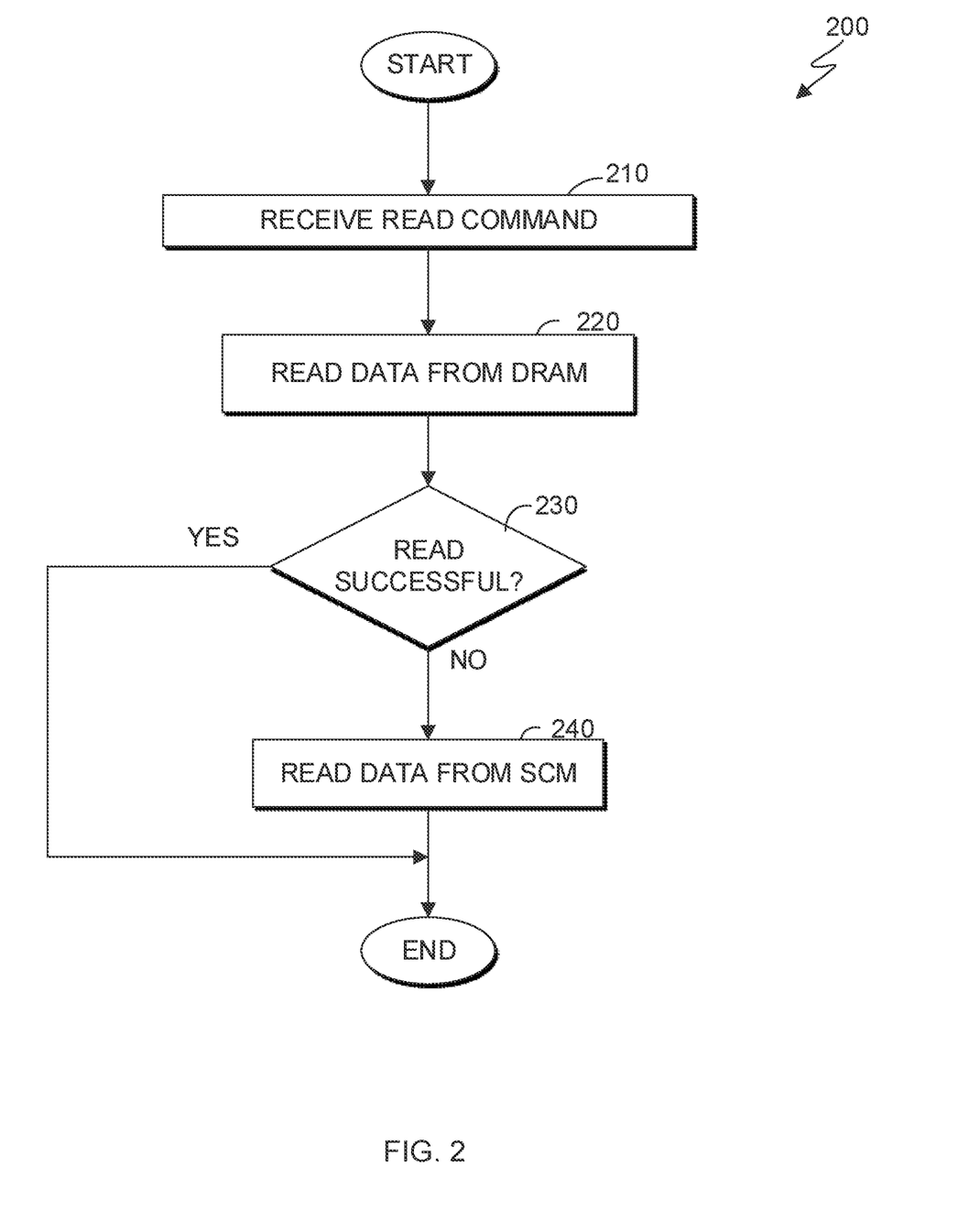
FIG. 2 is a flowchart depicting operational steps of a mirroring read logic executing within the memory system of FIG. 1, for retrieving data that has been mirrored and stored to dynamic random-access memory (DRAM) and storage class memory (SCM), in accordance with an embodiment of the present invention.

FIG. 2 depicts a flowchart 200 of the steps of mirroring read logic 125 executing within memory controller 110, as shown in FIG. 1. Mirroring read logic 125 operates to retrieve data, at the request of a read command, that has been stored to memory by mirroring write logic 120. Accordingly, the requested data has been stored to both DRAM 130 and SCM 140. Mirroring read logic 125 may be executed by memory controller 110.

In one embodiment, initially, data may be written to memory and mirrored by mirroring write logic 120 such that copies of the data are stored to both DRAM 130 and SCM 140.

In step 210, mirroring read logic 125 receives a read command for the data. A processor of the computing device (e.g., processor(s) 904 of computing device 900) may send the read command to memory controller 110.

In step 220, mirroring read logic 125 attempts to read the requested data from DRAM 130. In general, mirroring read logic 125 identifies the location on DRAM 130 where the data is stored based on the register and attempts to read the data via memory channel 150-A.

In decision 230, mirroring read logic 125 determines whether the data read was successful. If the read is successful, the data necessary to process the read command is able to be retrieved and the process is complete (decision 230, yes branch).

If mirroring read logic 125 is unable to read the requested data from DRAM 130, mirroring read logic 125 determines that the read is unsuccessful (decision 230, no branch) and reads the data from SCM 140 (step 240). In some instances, a data read may be unsuccessful due to, for example, faulty hardware components, corrupt software, a computer virus, or any number of reasons. Mirroring read logic 125 similarly identifies the location of the mirrored data by accessing the register and attempts to read the data from SCM 140 via memory channel 150-B. Subsequent to processing the read command by reading the data from SCM 140, the process is complete.

Figure 3:
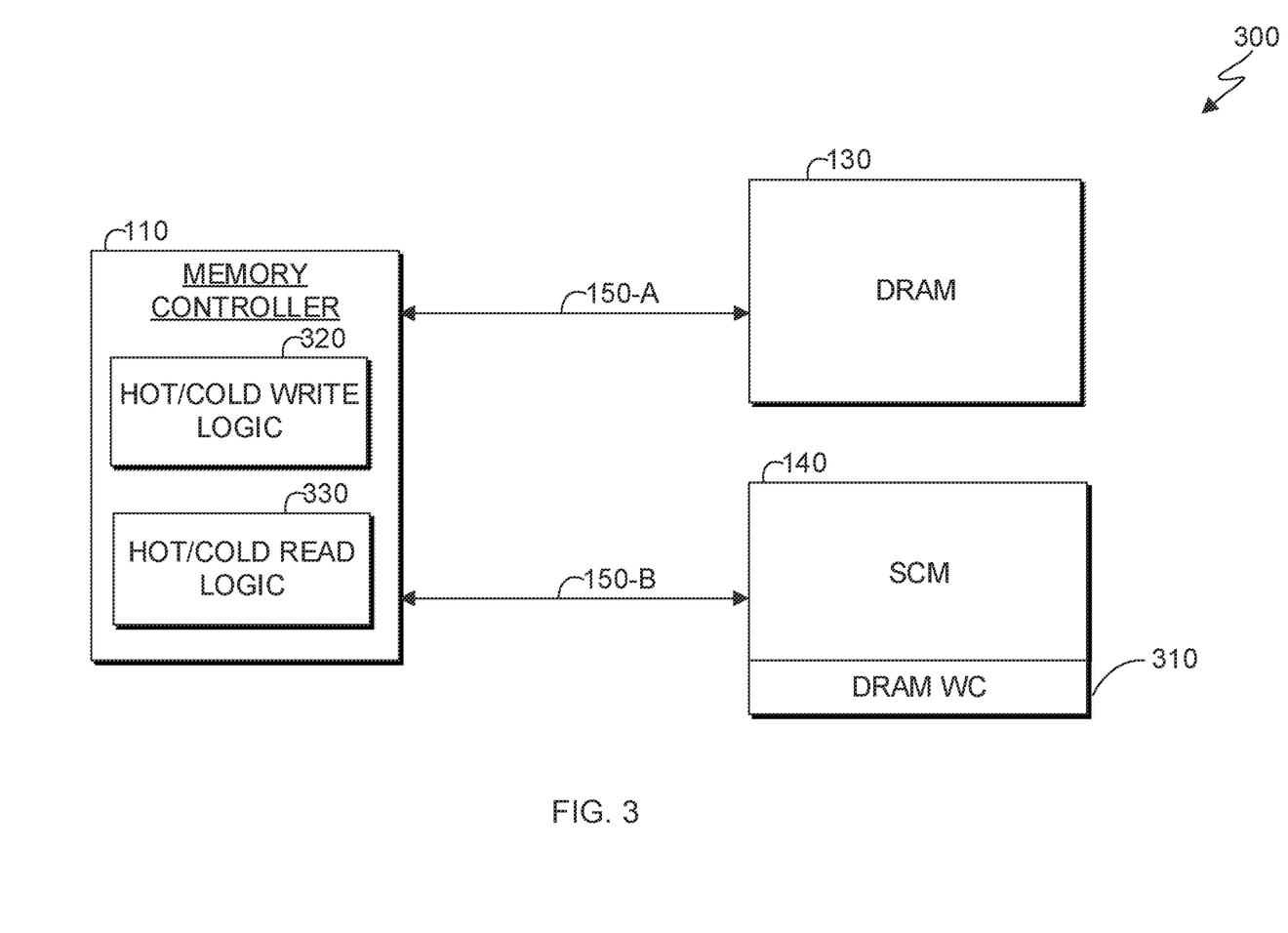
FIG. 3 is a functional block diagram illustrating a memory system of a computing device, in accordance with an embodiment of the present invention.

FIG. 3 depicts a block diagram of a memory system 300 of a computing device, such as computing device 900 as depicted in greater detail in FIG. 9, in accordance with an additional embodiment of the present invention. FIG. 3 depicts memory controller 110 operably connected to: (i) DRAM 130 via memory channel 150-A, (ii) SCM 140 via memory channel 150-B, and (iii) DRAM write cache (WC) 310 via memory channel 150-B. While the embodiment depicted in FIG. 3 depicts two memory channels 150 and one memory controller 110, memory system 300 may include any number of memory controllers and memory channels.

DRAM WC 310 represents a subset of the memory accessible via memory channel 150-B that is DRAM and, therefore, faster than SCM 140. DRAM WC 310 may represent a DRAM DIMM or a pool comprising multiple DRAM DIMMs. DRAM WC 310 may be, for example, mounted on a printed circuit board. DRAM WC 310 may include a series of DRAM integrated circuits. As depicted, DRAM WC 310 is smaller than that of SCM 140, indicating a smaller storage capacity.

In the embodiment depicted in FIG. 3, DRAM WC 310 is operably connected to memory controller 110 via memory channel 150-B.

In some embodiments, such as the embodiment depicted in FIG. 3, memory controller 110 includes hot/cold write logic 320 and hot/cold read logic 330. In other embodiments, hot/cold write logic 320 and hot/cold read logic 330 may be located on SCM 140.

Hot/cold write logic 320 may be implemented on memory controller 110 or may be located elsewhere in memory. For example, hot/cold write logic 320 may be imbedded/incorporated into the processor architecture and design. Hot/cold write logic 320 is configured to coordinate memory mirroring and direct the mirrored data to particular types of memory based on whether the data is considered to be hot data or cold data. More particularly, hot/cold write logic 320 causes the data to be written to DRAM 130. If the data is hot data, hot/cold write logic 320 causes the data to be mirrored to DRAM WC 310. If the data is cold data, hot/cold write logic 320 causes the data to be mirrored to SCM 140. In general, hot data is data that has access frequencies that exceed an access frequency threshold and cold data is data that is accessed less frequently and have access frequencies below an access frequency threshold. In general, hot data is stored to higher speed storage devices while cold data may be stored to cheaper, but lower speed storage devices. In general, DRAM WC 310 is a higher speed storage device than SCM 140. Embodiments of the present invention recognize that SCM may have, for example, slower write speeds than DRAM and therefore, by utilizing DRAM WC 310 for hot data writes, embodiments of the present invention can reduce backpressure on cache and nest layers that might occur due to differing write bandwidth and latency characteristics. A register (not depicted) may retain the location(s) in DRAM 130 of the original data, along with the location(s) in SCM 140 or DRAM WC 310 of the duplicated copy of the data. As depicted in FIG. 3, hot/cold write logic 320 causes data to be written to DRAM 130 via memory channel 150-A and hot/cold write logic 320 causes data to be written to SCM 140 or DRAM WC via memory channel 150-B. Hot/cold write logic 320 may be software or firmware or a combination of both.

Hot/cold read logic 330 may be implemented on memory controller 110 or may be located elsewhere in memory. For example, hot/cold read logic 330 may be imbedded/incorporated into the processor architecture and design. Hot/cold read logic 330 is configured to retrieve data that has been mirrored and stored to DRAM 130 (e.g., as primary storage) and either SCM 140 or DRAM WC (e.g., as backup storage). More particularly, hot/cold read logic 330 attempts to retrieve data from DRAM 130 and, if the retrieval is unsuccessful, hot/cold read logic 330 retrieves the mirrored copy of the data from either SCM 140 or DRAM WC 310 based on location data stored to a register. As depicted in FIG. 3, hot/cold read logic 330 accesses (i) DRAM 130 and (ii) SCM 140 and DRAM WC via separate memory channels 150. Hot/cold read logic 330 may be software or firmware or a combination of both.

Figure 4:
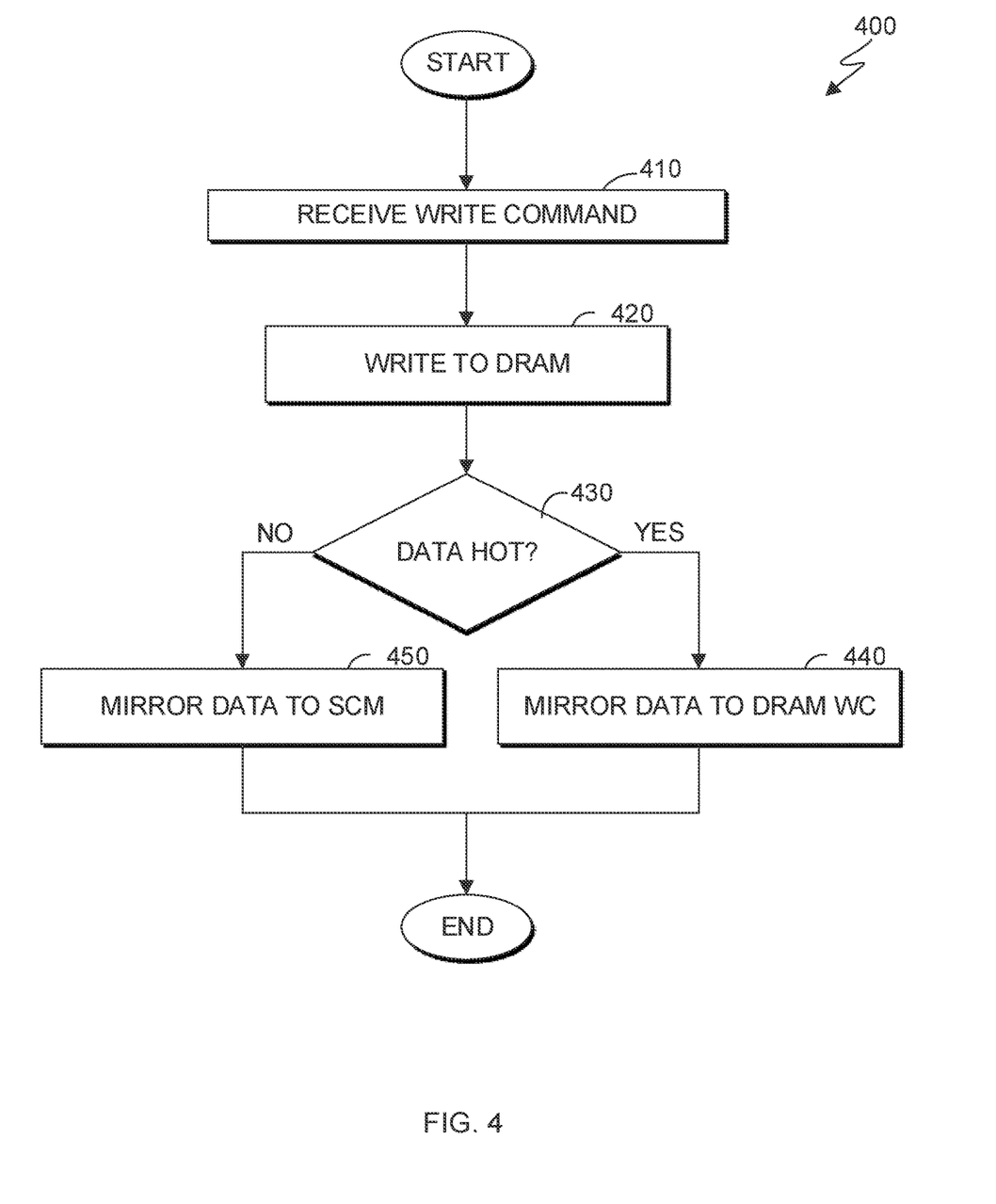
FIG. 4 is a flowchart depicting operational steps of a hot/cold write logic executing within the memory system of FIG. 3, for coordinating memory mirroring and direct the mirrored data to a particular type of memory based on whether the data is hot data or the data is cold data, in accordance with an embodiment of the present invention.

FIG. 4 depicts a flowchart 400 of the steps of hot/cold write logic 320 executing within memory controller 110, as shown in FIG. 3. Hot/cold write logic 320 operates to coordinate memory mirroring and direct the mirrored data to particular types of memory based on whether the data is considered to be hot data or cold data. Hot/cold write logic 320 may be executed by memory controller 110.

In step 410, hot/cold write logic 320 receives a write command for data. Hot/cold write logic 320 may receive the write command from a processor of the computing device (e.g., processor(s) 904 of computing device 900). In some embodiments, the write command may further specify whether the data is hot data (e.g., frequently accessed data that exceeds a threshold) or cold data (e.g., infrequently accessed data below the threshold).

In step 420, hot/cold write logic 320 writes the data to DRAM 130 via memory channel 150-A. Regardless of whether the data is considered to be hot data or cold data, hot/cold write logic stores a primary or main copy of the data to DRAM 130. Hot/cold write logic 320 may record the location within DRAM 130 where the data is stored to a register.

In decision 430, hot/cold write logic 320 determines whether the data is hot. In some embodiments, hot/cold write logic 320 may identify whether the data is hot based on a specification included with the write command indicating whether the data should be treated as hot data or cold data. In other embodiments, a register or index associated with memory controller 110 may record read/write attempts for different sets of data and hot/cold write logic 320 may determine whether the access attempts exceed a threshold. The threshold may be, for example, a particular number of access attempts over a specified period of time or a rate of access. In general, the threshold is tuned to indicate whether the data that is to be stored is accessed frequently or infrequently, and such a threshold may vary based on particular implementation settings.

If hot/cold write logic 320 determines that the data is hot (decision 430, yes branch), hot/cold write logic 320 writes a copy of the data to DRAM WC 310 via memory channel 150-B. As described above, DRAM WC 310 is a faster storage medium as compared to SCM 140 and therefore allows for faster writing, access, and/or retrieving of the more frequently accessed data in the event that DRAM 130 fails and accessing the mirrored data becomes necessary. Hot/cold write logic 320 may record the location within DRAM WC 310 where the data is stored to a register. Upon hot/cold write logic 320 writing the data to DRAM WC 310, the process is complete.

If hot/cold write logic 320 determines that the data is not hot (e.g., cold) (decision 430, no branch), hot/cold write logic 320 writes a copy of the data to SCM 140 via memory channel 150-B. In general, SCM 140 may be a slower and larger storage medium when compared to DRAM WC 310. Hot/cold write logic 320 may record the location within SCM 140 where the data is stored to a register. Upon hot/cold write logic 320 writing the data to SCM 140, the process is complete.

It should be noted that, as DRAM 130 is on a separate memory channel 150 than SCM 140 and DRAM WC 310, hot/cold write logic 320 may be able to simultaneously write data to DRAM 130 while also mirroring the data to either SCM 140 or DRAM WC 310.

Figure 5:
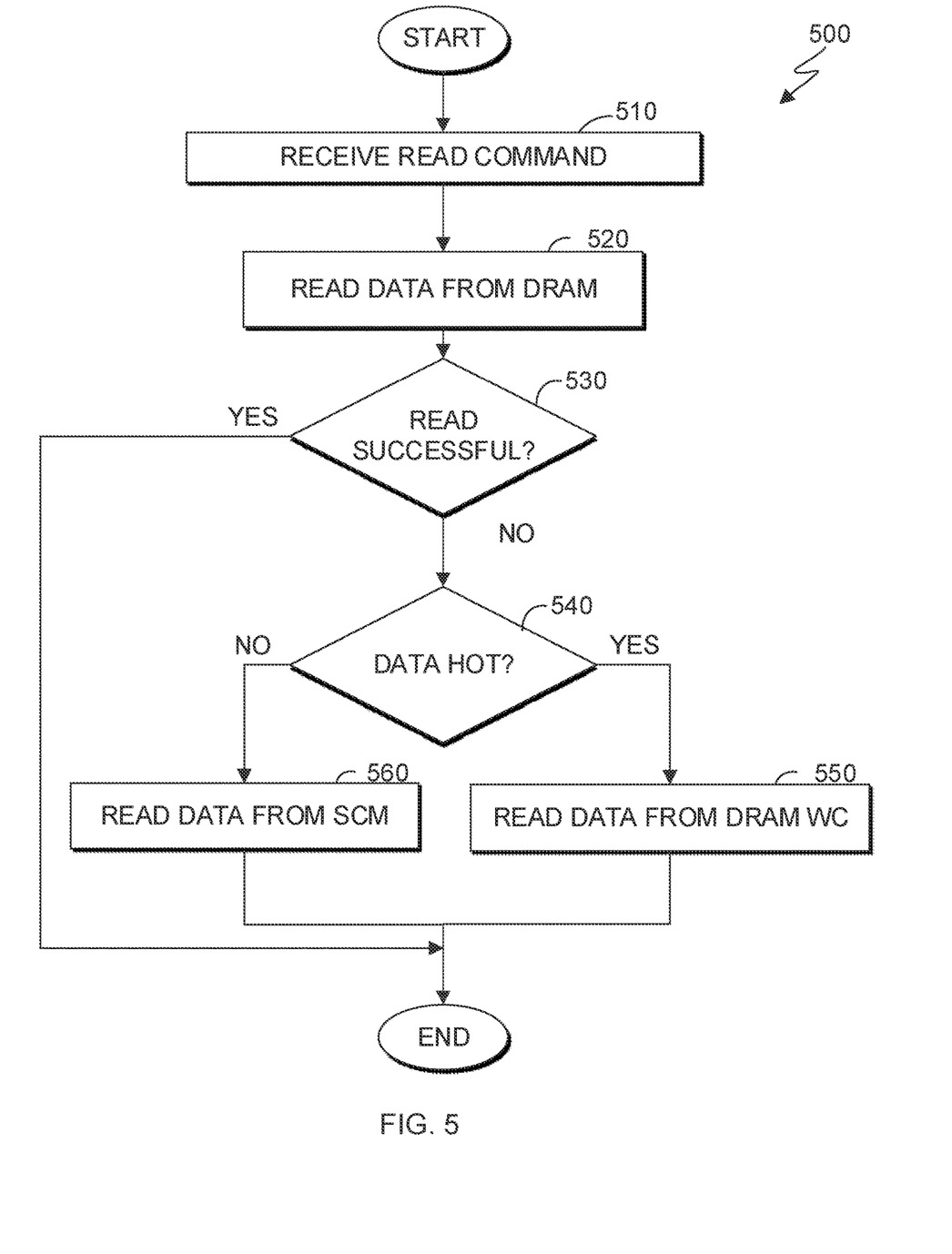
FIG. 5 is a flowchart depicting operation steps of a hot/cold read logic executing within the memory system of FIG. 3, for retrieving data that has been mirrored and stored to DRAM and either SCM or DRAM WC, in accordance with an embodiment of the present invention.

FIG. 5 depicts a flowchart 500 of the steps of hot/cold read logic 330 executing within memory controller 110, as shown in FIG. 3. Hot/cold read logic 330 operates to retrieve data, at the request of a read command, that has been stored to memory by hot/cold write logic 320. Accordingly, the requested data has been stored to both: (i) DRAM 130 and (ii) SCM 140 or DRAM WC 310. Hot/cold read logic 330 may be executed by memory controller 110.

In one embodiment, initially, data may be written to memory and mirrored by hot/cold write logic 320 such that copies of the data are stored to both: (i) DRAM 130 and (ii) SCM 140 or DRAM WC 310. Particular location data for both the primary and mirrored copies of the data may be stored to a register.

In step 510, hot/cold read logic 330 receives a read command for the data. A processor of the computing device (e.g., processor(s) 904 of computing device 900) may send the read command to memory controller 110. In some embodiments the read command may specify whether the data is hot or cold.

In step 520, hot/cold read logic 330 attempts to read the requested data from DRAM 130. In general, hot/cold read logic 330 identifies the location on DRAM 130 where the data is stored based on the register and attempts to read the data via memory channel 150-A.

In decision 530, hot/cold read logic 330 determines whether the data read was successful. If the read is successful, the data necessary to process the read command is able to be retrieved and the process is complete (decision 530, yes branch).

If hot/cold read logic 330 is unable to read the requested data from DRAM 130, hot/cold read logic 330 determines that the read is unsuccessful (decision 530, no branch) and determines whether the data that was stored was hot (decision 540). In some instances, a data read may be unsuccessful due to, for example, faulty hardware components, corrupt software, a computer virus, or any number of reasons. In some embodiments, the read command received by hot/cold read logic 330 may identify whether the stored data has been classified as hot data or cold data. In other embodiments, hot/cold read logic 330 may access a register and determine where the data was stored based on the classification established by hot/cold write logic 320.

If hot/cold read logic 330 determines that the stored data is hot (decision 540, yes branch), hot/cold read logic 330 reads the data from DRAM WC 310 (step 550). Hot/cold read logic 330 identifies the location of the mirrored data by accessing the register associated with DRAM WC 310 and attempts to read the data from DRAM WC 310 via memory channel 150-B. Subsequent to processing the read command by reading the data from DRAM WC310, the process is complete.

If hot/cold read logic 330 determines that the stored data is not hot (i.e., cold) (decision 540, no branch), hot/cold read logic 330 reads the data from SCM 140 (step 560). Hot/cold read logic 330 identifies the location of the mirrored data by accessing the register associated with SCM 140 and attempts to read the data from SCM 140 via memory channel 150-B. Subsequent to processing the read command by reading the data from SCM 140, the process is complete.

Figure 6:
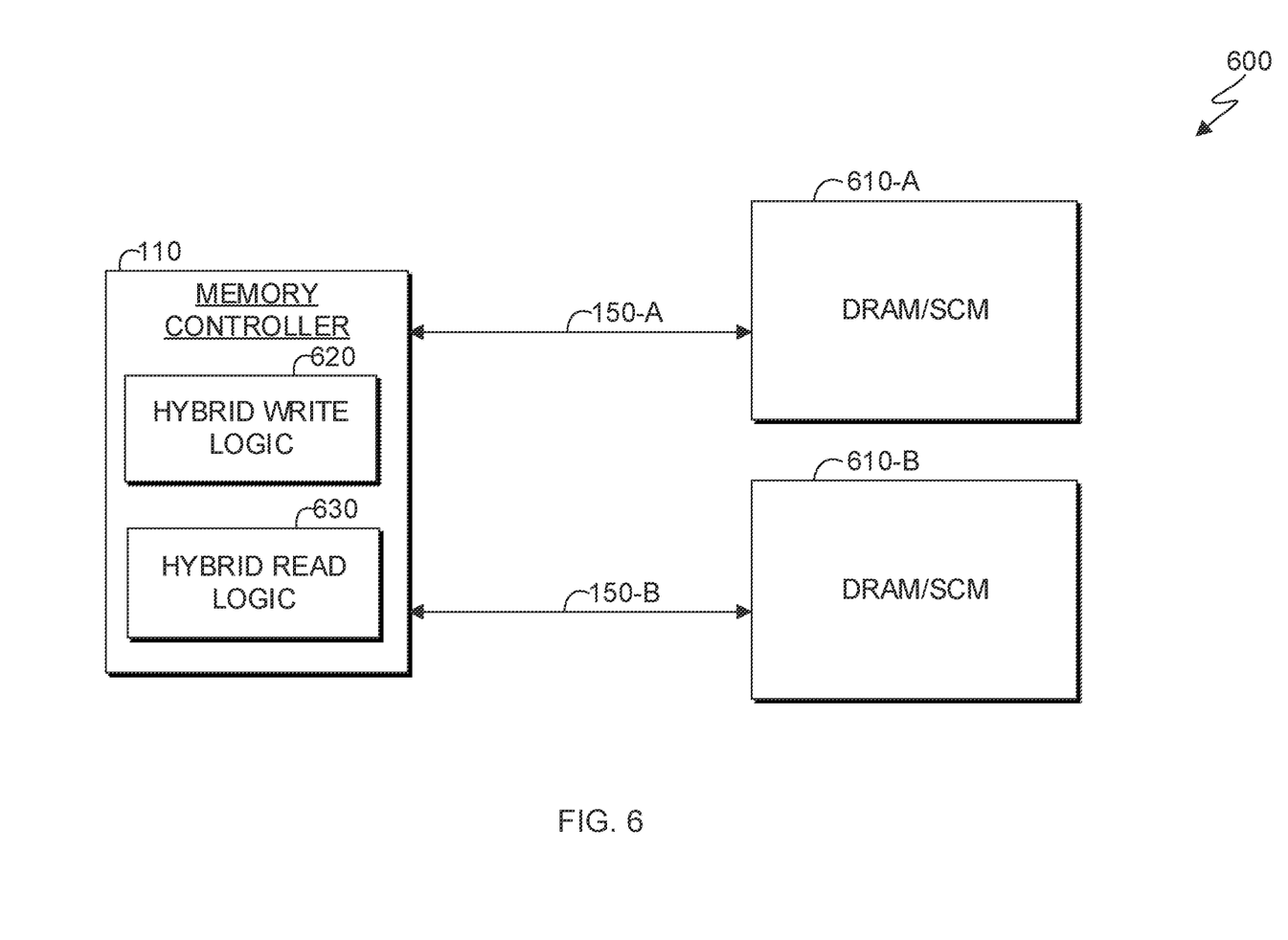
FIG. 6 is a functional block diagram illustrating a memory system of a computing device, in accordance with an embodiment of the present invention.

FIG. 6 depicts a block diagram of a memory system 600 of a computing device, such as computing device 900 as depicted in greater detail in FIG. 9, in accordance with an additional embodiment of the present invention. FIG. 6 depicts memory controller 110 operably connected to: (i) DRAM/SCM 610-A via memory channel 150-A and (ii) DRAM/SCM 610-B via memory channel 150-B. While the embodiment depicted in FIG. 6 depicts two memory channels 150 and one memory controller 110, memory system 600 may include any number of memory controllers and memory channels.

DRAM/SCM 610-A and DRAM/SCM 610-B each represent a hybrid DRAM/SCM DIMM, a pool comprising multiple hybrid DRAM/SCM DIMMs, or a hybrid DRAM/SCM located on a printed circuit board (PCB). A hybrid DIMM is a DIMM that includes two different types of memory. For example, hybrid DIMMs may include DRAM, NAND flash, SCM, or other types of memory capable of being operably affixed to a DIMM. In some embodiments, hybrid DIMMs may be designed according to the non-volatile DIMM-P (NVDIMM-P) specification. NVDIMM-P is a specification that enables computer main memory to be persisting using persistent memory technology and care share a DIMM interconnect with DRAM DIMMs. In some instances, a hybrid DIMM may include one or more controllers that act as primary interface(s) to the system and account for any latency difference(s) between the different types of memory located on the DIMM. Some embodiments of the present invention utilize a hybrid DRAM/SCM DIMM. In some embodiments each hybrid DRAM/SCM DIMM has equal storage capacity for each type of memory (i.e., half of the storage capacity of DRAM/SCM 610-A is DRAM and the other half is SCM). In some embodiments, the storage capacity of each DRAM/SCM DIMM may vary both in terms of individual DIMM storage capacity and the respect storage capacities of the DRAM and SCM on the DIMMs. For example, embodiments of the present invention recognize that in the embodiment depicted by FIG. 3, rather than being located on separate DIMMs, SCM 140 and DRAM WC 310 may comprise one or more hybrid DRAM/SCM DIMMs where, typically, SCM 140 has higher storage capacity than DRAM WC 310. While embodiments utilizing one or more hybrid DRAM/SCM DIMMs are emphasized in regards to FIGS. 6 and 7, embodiments of the present invention recognize that a hybrid DRAM/SCM otherwise located on a PCB may be utilized with similar functionality.

In the embodiment depicted in FIG. 6, DRAM/SCM 610-A is operably connected to memory controller 110 via memory channel 150-A and DRAM/SCM 610-B is operable connected to memory controller 110 via memory channel 150-B.

In some embodiments, such as the embodiment depicted in FIG. 6, memory controller 110 includes hybrid write logic 620 and hybrid read logic 630.

Hybrid write logic 620 may be implemented on memory controller 110 or may be located elsewhere in memory. For example, hybrid write logic 620 may be imbedded/incorporated into the processor architecture and design. Hybrid write logic 620 is configured to coordinate memory mirroring by writing data to a DRAM portion(s) of DRAM/SCM 610 and direct the mirrored data to SCM portion(s) of DRAM/SCM 610, albeit portions on a different DIMM accessible via a different memory channel 150. For example, hybrid write logic 620 may cause (i) data to be written to the DRAM portion of DRAM/SCM 610-A over memory channel 150-A and (ii) the data to be mirrored to an SCM portion of DRAM/SCM 610-B over memory channel 150-B. Mirroring the data to different channels can, in some embodiments, allow memory controller 110 and/or hybrid write logic 620 to write the primary version of the data and the mirrored version of the data in parallel (e.g., cache lines of the data can be sent simultaneously), thereby allowing for usage of the full bandwidth of each memory channel 150 when writing the primary and mirrored versions of the data. In some embodiments, a first portion of the address space of a register (not depicted) may (i) utilize the DRAM from DRAM/SCM 610-A as primary storage and (ii) utilize the SCM from DRAM/SCM 610-B as secondary storage. In such an embodiments, a second portion of the address space may utilize the DRAM from DRAM/SCM 610-B as primary storage and (ii) utilize the SCM from DRAM/SCM 610-A as secondary storage. The register may retain the location(s) in DRAM/SCM 610-A and DRAM/SCM 610-B of both the original data stored to DRAM and the duplicated copy of the data that has been mirrored to SCM via a different memory channel. As depicted in FIG. 6, hybrid write logic 620 may write the primary version of the data to DRAM portion of either DRAM/SCM 610-A or DRAM/SCM 610-B. Then, based on the location selected for the storage of the primary version of the data, hybrid write logic 620 will select a portion of SCM from either DRAM/SCM 610-A or DRAM/

SCM 610-B that is accessible via a different memory channel 150 to store the backup or mirrored version of the data As depicted in FIG. 6, hybrid write logic 620 accesses (i) DRAM/SCM 610-A and (ii) DRAM/SCM 610-B via separate memory channels 150. Hybrid write logic 620 may be software or firmware or a combination of both.

Hybrid read logic 630 may be implemented on memory controller 110 or may be located elsewhere in memory. For example, hybrid read logic may be imbedded/incorporated into the processor architecture and design. Hybrid read logic is configured to retrieve data that has been mirrored and stored to a DRAM portion of DRAM/SCM 610 (e.g., 610-A) and an SCM portion of DRAM/SCM 610 (e.g., 610-B) accessible via a different memory channel 150. More particularly, hybrid read logic 630 attempts to retrieve data from a respective DRAM portion of DRAM/SCM 610 that has previously stored the primary version of the data and, if the retrieval is unsuccessful, hybrid read logic 630 retrieves the mirrored copy of the data from a respective SCM portion of DRAM/SCM 610 that is accessible via a different memory channel 150 based on location data stored to a register. As depicted in FIG. 6, hybrid read logic 630 accesses DRAM/SCM 610-A via memory channel 150-A and hybrid read logic 630 accesses DRAM/SCM 610-B via memory channel 150-B. Hybrid read logic 630 may be software or firmware or a combination of both.

Figure 7:
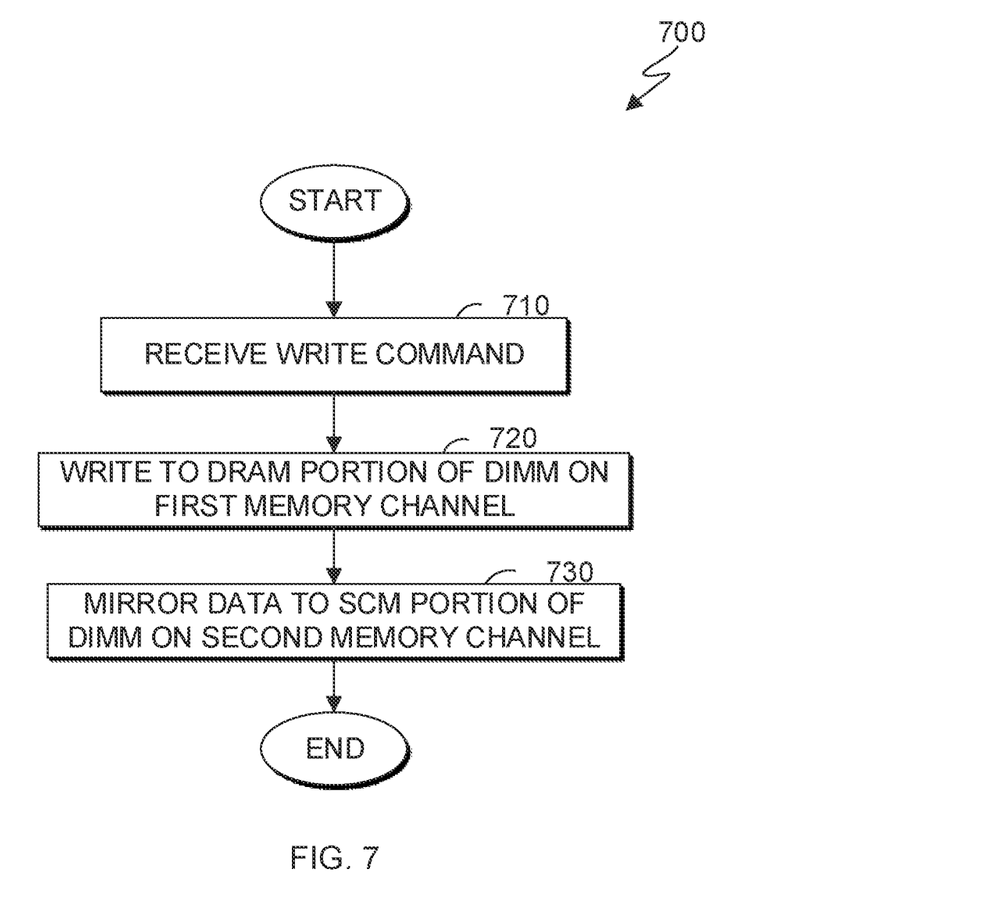
FIG. 7 is a flowchart depicting operational steps of a hybrid write logic executing within the memory system of FIG. 6, for coordinating memory mirroring by writing data to a DRAM portion of hybrid DRAM/SCM and mirroring to an SCM portion of hybrid DRAM/SCM that is accessible via a different memory channel, in accordance with an embodiment of the present invention.

FIG. 7 depicts a flowchart 700 of the steps of hybrid write logic 620 executing within memory controller 110, as shown in FIG. 6. Hybrid write logic 620 operates to coordinate memory mirroring and direct the mirrored data to one or more SCM portions of DRAM/SCM 610 that are on a different memory channel 150 than where the primary data is to be stored. Hybrid write logic 620 may be executed by memory controller 110.

In step 710, hybrid write logic 620 receives a write command for data. Hybrid write logic 620 may receive the write command from a processor of the computing device (e.g., processor(s) 904 of computing device 900).

In step 720, hybrid write logic 620 writes the data to a DRAM portion of DRAM/SCM 610-A over memory channel 150-A or a DRAM portion of DRAM/SCM 610-B over memory channel 150-B. Selection of the DRAM/SCM 610-A. DRAM/SCM 610-B, or other DRAM/SCM hybrid DIMMs (not shown) may be based on any memory selection techniques known in the art. Hybrid write logic 620 may record the location within the portion of DRAM where the data is stored to a register.

In step 730, hybrid write logic 620 writes a copy of the data to an SCM portion of DRAM/SCM 610-A over memory channel 150-A or an SCM portion of DRAM/SCM 610-B over memory channel 150-B. Selection of the DRAM/SCM 610-A. DRAM/SCM 610-B, or other DRAM/SCM hybrid DIMMs (not shown) depends on where hybrid write logic wrote the data in step 720. In general, hybrid write logic 620 selects a portion of SCM that resides on a DRAM/SCM 610 that is accessible via a different memory channel than the portion of DRAM that stores the data written by hybrid write logic during step 720. Hybrid write logic 620 may record the location within the portion of SCM where the data is stored to a register.

It should be noted that, as DRAM/SCM 610-A is on a separate memory channel 150 than DRAM/SCM 610-B, hybrid write logic 620 may be able to simultaneously write primary data and mirrored data to DRAM/SCM 610-A and DRAM/SCM 610-B.

Upon writing the primary data to a DRAM portion and mirroring the data to an SCM portion accessible via a separate memory channel 150, the process is complete.

Figure 8:
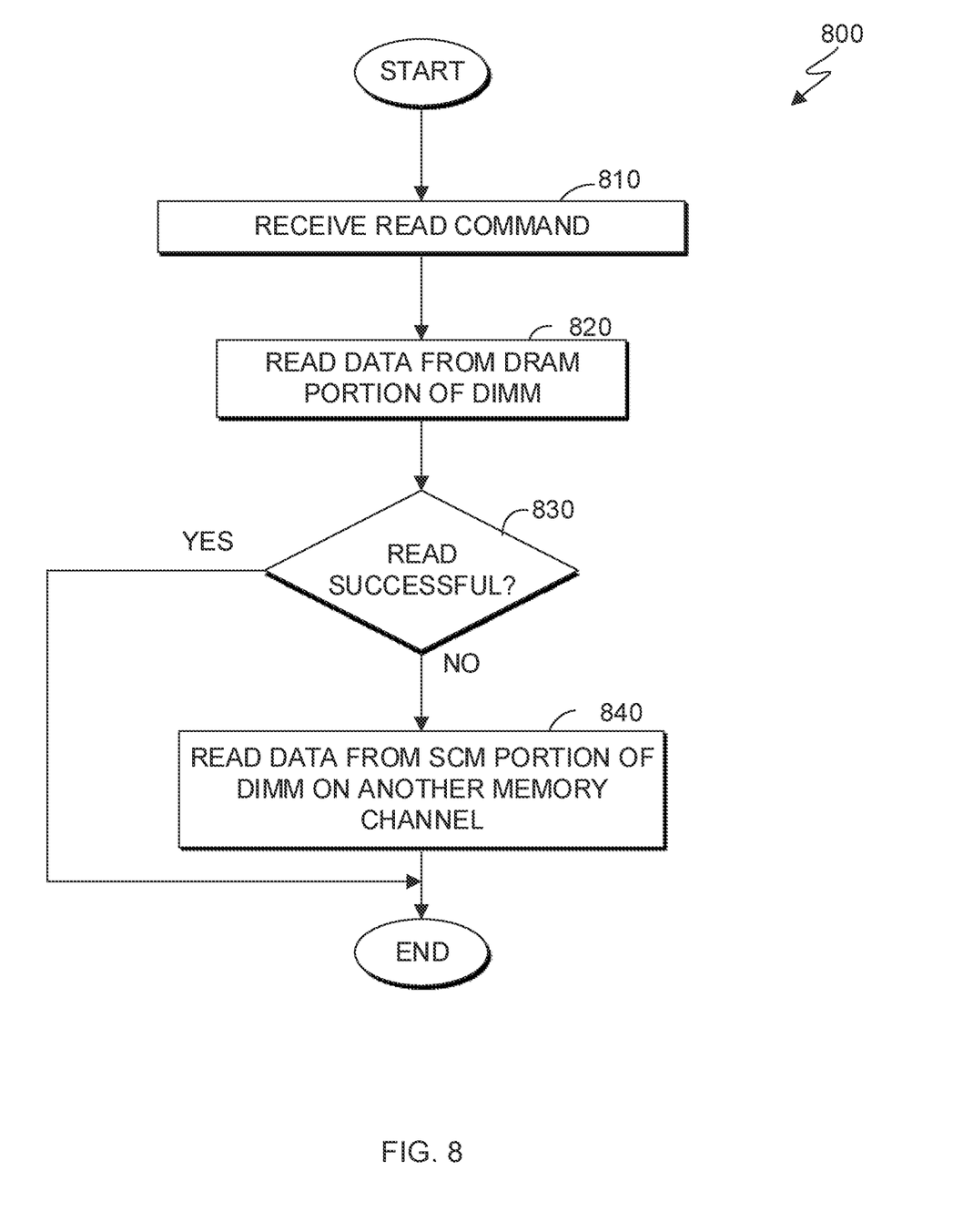
FIG. 8 is a flowchart depicting operational steps of a hybrid read logic executing within the memory system of FIG. 6, for retrieving data that has been mirrored and stored to a DRAM portion of hybrid DRAM/SCM and an SCM portion of hybrid DRAM/SCM DIMM that is accessible via a different memory channel, in accordance with an embodiment of the present invention.

FIG. 8 depicts a flowchart 800 of the steps of hybrid read logic 630 executing within memory controller 110, as shown in FIG. 6. Hybrid read logic 630 operates to retrieve data, at the request of a read command, that has been stored to memory by hybrid write logic 620. Accordingly, the requested data has been stored to both a (i) DRAM portion of one of DRAM/SCM 610 (e.g., DRAM/SCM 610-A or DRAM/SCM 610-B) and (ii) an SCM portion of a DRAM/SCM 610 accessible via a different memory channel 150 than the respective DRAM portion. Hybrid read logic 630 may be executed by memory controller 110.

In one embodiment, initially, data may be written to memory and mirrored by hybrid write logic 620 such that copies of the data are stored to both DRAM portion(s) of DRAM/SCM 610 and SCM portion(s) of DRAM/SCM 610 that are accessible via different memory channels 150. For simplicity sake, the remainder of the steps will be discussed based on an example where the data is stored to a DRAM portion of DRAM/SCM 610-A via memory channel 150-A and a copy of the data is mirrored to an SCM portion of DRAM/SCM 610-B via memory channel 150-B. However, it should be noted that the data may be stored on different DRAM/SCM 610 DIMMs, so long as the DRAM portion is on a different memory channel 150 than the SCM portion.

In step 810, hybrid read logic 630 receives a read command for the data. A processor of the computing device (e.g., processor(s) 904 of computing device 900) may send the read command to memory controller 110.

In step 820, hybrid read logic 630 attempts to read the requested data from the DRAM portion of DRAM/SCM 610-A. In general, hybrid read logic 630 identifies the location on the DRAM portion of DRAM/SCM 610-A where the data is stored based on the register and attempts to read the data via memory channel 150-A.

In decision 830, hybrid read logic 630 determines whether the data read was successful. If the read is successful, the data necessary to process the read command is able to be retrieved and the process s complete (decision 830, yes branch).

If hybrid read logic 630 is unable to read the requested data from the DRAM portion of DRAM/SCM 610-A, hybrid read logic 630 determines that the read is unsuccessful (decision 830, no branch) and reads the data from the SCM portion of DRAM/SCM 610-B (step 840). In some instances, a data read may be unsuccessful due to, for example, faulty hardware components, corrupt software, a computer virus, or any number of reasons. Hybrid read logic 630 similarly identifies the location of the mirrored data by accessing the register and attempts to read the data from the SCM portion of DRAM/SCM 610-B via memory channel 150-B. Subsequent to processing the read command by reading the data from the SCM portion of DRAM/SCM 610-B, the process is complete.

It shall be noted that in various embodiments of the present invention, features described may be combined. For example, the hot/cold data feature described in reference to FIGS. 3-5 may be implemented utilizing a hybrid DIMM as described in reference to FIGS. 6-8. Any combination of the features described herein are contemplated by embodiments of the present invention.

FIG. 9 depicts a block diagram of components of a computing device associated with memory system 100, memory system 300, and/or memory system 600 in accordance with an illustrative embodiment of the present invention. It should be appreciated that FIG. 9 provides only an illustration of one implementation and does not imply any limitations with regard to the environments in which different embodiments may be implemented. Many modifications to the depicted environment may be made.

The computer device includes communications fabric 902, which provides communications between cache 916, memory 906, persistent storage 908, communications unit 910, and input/output (I/O) interface(s) 912. Communications fabric 902 can be implemented with any architecture designed for passing data and/or control information between processors (such as microprocessors, communications and network processors, etc.), system memory, peripheral devices, and any other hardware components within a system. For example, communications fabric 902 can be implemented with one or more buses or a crossbar switch.

Memory 906 and persistent storage 908 are computer readable storage media. In this embodiment, memory 906 includes, but is not limited to, random access memory (RAM), DRAM, and SCM. In general, memory 906 can include any suitable volatile or non-volatile computer readable storage media. Cache 916 is a fast memory that enhances the performance of computer processor(s) 904 by holding recently accessed data, and data near accessed data, from memory 906.

Program(s) may be stored in persistent storage 908 and in memory 906 for execution by one or more of the respective computer processors 904 via cache 916. In an embodiment, persistent storage 908 includes a magnetic hard disk drive. Alternatively, or in addition to a magnetic hard disk drive, persistent storage 908 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 908 may also be removable. For example, a removable hard drive may be used for persistent storage 908. Other examples include optical and magnetic disks, thumb drives, and smart cards that are inserted into a drive for transfer onto another computer readable storage medium that is also part of persistent storage 908.

Communications unit 910, in these examples, provides for communications with other data processing systems or devices. In these examples, communications unit 910 includes one or more network interface cards. Communications unit 910 may provide communications through the use of either or both physical and wireless communications links. Programs and/or firmware may be downloaded to persistent storage 908 through communications unit 910.

I/O interface(s) 912 allows for input and output of data with other devices that may be connected to the computing device. For example, I/O interface 912 may provide a connection to external devices 918 such as a keyboard, keypad, a touch screen, and/or some other suitable input device. External devices 918 can also include portable computer readable storage media such as, for example, thumb drives, portable optical or magnetic disks, and memory cards. Software, firmware, and data used to practice embodiments of the present invention, e.g., mirroring write logic 120, mirroring read logic 125, hot/cold write logic 320, hot/cold read logic 330, hybrid write logic 620, and hybrid read logic 630, can be stored on such portable computer readable storage media and can be loaded onto persistent storage 908 via I/O interface(s) 912. I/O interface(s) 912 also connect to a display 920.

Display 920 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method comprising:
   receiving a first request to write data to memory, wherein the memory comprises:
      a first set of dynamic random-access memory (DRAM) accessible via a first memory channel; and
      a first set of storage class memory (SCM) accessible via a second memory channel;
   writing the data to the first set of DRAM via the first memory channel; and
   minoring the data to the first set of SCM via the second memory channel.

2. The computer-implemented method of claim 1, further comprising:
   receiving a second request to read the data from the memory;
   attempting to read the data from the first set of DRAM via the first memory channel;
   determining that the attempt to read the data from the first set of DRAM failed; and
   responsive to determining that the attempt to read the data from the first set of DRAM failed, reading the data from the first set of SCM via the second memory channel.

3. The computer-implemented method of claim 1, wherein the memory further comprises:
   a first dual in-line memory module (DIMM) accessible via the first memory channel, the first DIMM including:
      the first set of DRAM; and
      a second set of SCM; and
   a second DIMM accessible via the second memory channel, the second DIMM including:
      a second set of DRAM; and
      the first set of SCM.

4. The computer-implemented method of claim 3, further comprising:
   receiving a second request to read the data from the memory;
   attempting to read the data from the first set of DRAM of the first DIMM via the first memory channel;
   determining that the attempt to read the data from the first set of DRAM failed;
   responsive to determining that the attempt to read the data from the first set of DRAM failed, reading the data from the first set of SCM of the second DIMM via the second memory channel.

5. The computer-implemented method of claim 1, wherein:
   the memory further comprises a DRAM write cache accessible via the second memory channel; and mirroring the data to the first set of SCM via the second memory channel comprises:
  determining that the data is below an access frequency threshold; and
  responsive to determining that the data is below the access frequency threshold, mirroring the data to the first set of SCM via the second memory channel.

6. The computer-implemented method of claim 5, further comprising:
  receiving a second request to read the data from the memory;
  attempting to read the data from the first set of DRAM via the first memory channel;
  determining that the attempt to read the data from the first set of DRAM failed;
  determining that the data, when stored, was below the access frequency threshold; and
  responsive to determining that (i) the attempt to read the data from the first set of DRAM failed and (ii) the data, when stored, was below the access frequency threshold, reading the data from the first set of SCM via the second memory channel.

7. The computer-implemented method of claim 5, further comprising:
  receiving a second request to write a second set of data to the memory;
  writing the second set of data to the first set of DRAM via the first memory channel;
  determining that the second set of data exceeds the access frequency threshold; and
  responsive to determining that the data exceeds the access frequency threshold, mirroring the data to the DRAM write cache via the second memory channel.

8. A computer program product comprising:
  one or more computer readable storage media, and program instructions collectively stored on the one or more computer readable storage media, the program instructions comprising:
    program instructions to receive a first request to write data to memory, wherein the memory comprises:
      a first set of dynamic random-access memory (DRAM) accessible via a first memory channel; and
      a first set of storage class memory (SCM) accessible via a second memory channel;
    program instructions to write the data to the first set of DRAM via the first memory channel; and
    program instructions to mirror the data to the first set of SCM via the second memory channel.

9. The computer program product of claim 8, further comprising:
  program instructions, collectively stored on the one or more computer readable storage media, to receive a second request to read the data from the memory;
  program instructions, collectively stored on the one or more computer readable storage media, to attempt to read the data from the first set of DRAM via the first memory channel;
  program instructions, collectively stored on the one or more computer readable storage media, to determine that the attempt to read the data from the first set of DRAM failed; and
  program instructions, collectively stored on the one or more computer readable storage media, to, responsive to determining that the attempt to read the data from the first set of DRAM failed, read the data from the first set of SCM via the second memory channel.

10. The computer program product of claim 8, wherein the memory further comprises:
  a first dual in-line memory module (DIMM) accessible via the first memory channel, the first DIMM including:
    the first set of DRAM; and
    a second set of SCM; and
  a second DIMM accessible via the second memory channel, the second DIMM including:
    a second set of DRAM; and
    the first set of SCM.

11. The computer program product of claim 10, further comprising:
  program instructions, collectively stored on the one or more computer readable storage media, to receive a second request to read the data from the memory;
  program instructions, collectively stored on the one or more computer readable storage media, to attempt to read the data from the first set of DRAM of the first DIMM via the first memory channel;
  program instructions, collectively stored on the one or more computer readable storage media, to determine that the attempt to read the data from the first set of DRAM failed;
  program instructions, collectively stored on the one or more computer readable storage media, to responsive to determining that the attempt to read the data from the first set of DRAM failed, read the data from the first set of SCM of the second DIMM via the second memory channel.

12. The computer program product of claim 8, wherein:
  the memory further comprises a DRAM write cache accessible via the second memory channel; and
  program instructions to mirror the data to the first set of SCM via the second memory channel comprise:
    program instructions to determine that the data is below an access frequency threshold; and
    program instructions to, responsive to determining that the data is below the access frequency threshold, minor the data to the first set of SCM via the second memory channel.

13. The computer program product of claim 12, further comprising:
  program instructions, collectively stored on the one or more computer readable storage media, to receive a second request to read the data from the memory;
  program instructions, collectively stored on the one or more computer readable storage media, to attempt to read the data from the first set of DRAM via the first memory channel;
  program instructions, collectively stored on the one or more computer readable storage media, to determine that the attempt to read the data from the first set of DRAM failed;
  program instructions, collectively stored on the one or more computer readable storage media, to determine that the data, when stored, was below the access frequency threshold; and
  program instructions, collectively stored on the one or more computer readable storage media, to responsive to determining that (i) the attempt to read the data from the first set of DRAM failed and (ii) the data, when stored, was below the access frequency threshold, read the data from the first set of SCM via the second memory channel.

14. The computer program product of claim 12, further comprising:

program instructions, collectively stored on the one or more computer readable storage media, to receive a second request to write a second set of data to the memory;

program instructions, collectively stored on the one or more computer readable storage media, to write the second set of data to the first set of DRAM via the first memory channel;

program instructions, collectively stored on the one or more computer readable storage media, to determine that the second set of data exceeds the access frequency threshold; and program instructions, collectively stored on the one or more computer readable storage media, to, responsive to determining that the second set of data exceeds the access frequency threshold, mirror the second set of data to the DRAM write cache via the second memory channel.

15. A computer system comprising:

a memory controller;

memory, wherein the memory comprises:
 a first set of dynamic random-access memory (DRAM) accessible via a first memory channel; and
 a first set of storage class memory accessible via a second memory channel;

one or more computer readable storage media; and program instructions collectively stored on the one or more computer readable storage media for execution by the memory controller, the program instructions comprising:
 program instructions to receive a first request to write data to the memory;
 program instructions to write the data to the first set of DRAM via the first memory channel; and
 program instructions to mirror the data to the first set of SCM via the second memory channel.

16. The computer system of claim 15, further comprising:

program instructions, collectively stored on the one or more computer readable storage media for execution by the memory controller, to receive a second request to read the data from the memory;

program instructions, collectively stored on the one or more computer readable storage media for execution by the memory controller, to attempt to read the data from the first set of DRAM via the first memory channel;

program instructions, collectively stored on the one or more computer readable storage media for execution by the memory controller, to determine that the attempt to read the data from the first set of DRAM failed; and program instructions, collectively stored on the one or more computer readable storage media for execution by the memory controller, to, responsive to determining that the attempt to read the data from the first set of DRAM failed, read the data from the first set of SCM via the second memory channel.

17. The computer system of claim 15, wherein the memory further comprises:

a first dual in-line memory module (DIMM) accessible via the first memory channel, the first DIMM including:
 the first set of DRAM; and
 a second set of SCM; and a second DIMM accessible via the second memory channel, the second DIMM including:
 a second set of DRAM; and
 the first set of SCM.

18. The computer system of claim 17, further comprising:

program instructions, collectively stored on the one or more computer readable storage media for execution by the memory controller, to receive a second request to read the data from the memory;

program instructions, collectively stored on the one or more computer readable storage media for execution by the memory controller, to attempt to read the data from the first set of DRAM of the first DIMM via the first memory channel;

program instructions, collectively stored on the one or more computer readable storage media for execution by the memory controller, to determine that the attempt to read the data from the first set of DRAM failed;

program instructions, collectively stored on the one or more computer readable storage media for execution by the memory controller, to responsive to determining that the attempt to read the data from the first set of DRAM failed, read the data from the first set of SCM of the second DIMM via the second memory channel.

19. The computer system of claim 15, wherein:

the memory further comprises a DRAM write cache accessible via the second memory channel; and program instructions to mirror the data to the first set of SCM via the second memory channel comprise:
 program instructions to determine that the data is below an access frequency threshold; and
 program instructions to, responsive to determining that the data is below the access frequency threshold, minor the data to the first set of SCM via the second memory channel.

20. The computer system of claim 19, further comprising:

program instructions, collectively stored on the one or more computer readable storage media for execution by the memory controller, to receive a second request to read the data from the memory;

program instructions, collectively stored on the one or more computer readable storage media for execution by the memory controller, to attempt to read the data from the first set of DRAM via the first memory channel;

program instructions, collectively stored on the one or more computer readable storage media for execution by the memory controller, to determine that the attempt to read the data from the first set of DRAM failed;

program instructions, collectively stored on the one or more computer readable storage media for execution by the memory controller, to determine that the data, when stored, was below the access frequency threshold; and program instructions, collectively stored on the one or more computer readable storage media for execution by the memory controller, to responsive to determining that (i) the attempt to read the data from the first set of DRAM failed and (ii) the data, when stored, was below the access frequency threshold, read the data from the first set of SCM via the second memory channel.

* * * * *